United States Patent [19]

Logan et al.

[11] Patent Number: 4,953,170

[45] Date of Patent: Aug. 28, 1990

[54] METHOD FOR FORMING A HETEROEPITAXIAL STRUCTURE, AND A DEVICE MANUFACTURED THEREBY

[75] Inventors: Ralph A. Logan, Morristown; Tawee Tanbun-ek, Summit; Henryk Temkin, Berkeley Heights, all of N.J.

[73] Assignee: AT&T Bell Laboratories, Murray Hill, N.J.

[21] Appl. No.: 366,829

[22] Filed: Jun. 15, 1989

[51] Int. Cl.[5] .............................................. H01S 3/19
[52] U.S. Cl. ...................................... 372/44; 372/46; 372/50
[58] Field of Search ............................. 372/44, 46, 50

[56] References Cited

U.S. PATENT DOCUMENTS 3,982,207 9/1976 Dingle et al. ................ 331/94.5 H
4,599,728 7/1986 Alavi et al. ............................ 372/45

Primary Examiner—William L. Sikes
Assistant Examiner—Robert E. Wise
Attorney, Agent, or Firm—Martin I. Finston

[57] ABSTRACT

Described is a method for forming epitaxial films comprising successive layers of at least ternary and at least quaternary III-V material grown by metalorganic vapor-phase epitaxy. Between the steps of growing successive layers, the growth chamber is first flushed, advantageously in successive steps using a pair of gaseous Group V hybrides, a few monolayers of binary III-V material are then deposited, and then the growth chamber is again flushed. As a result, interfaces are sharper and interfacial defects are reduced. Also described are quantum well lasers made according to the inventive method.

9 Claims, 2 Drawing Sheets

METHOD FOR FORMING A HETEROEPITAXIAL STRUCTURE, AND A DEVICE MANUFACTURED THEREBY

BACKGROUND OF THE INVENTION

Quantum well lasers have very favorable properties for use in optoelectronic integrated circuits and optical communication systems. In this regard, there has been extensive study of quantum well lasers, including single quantum well lasers, fabricated from heteroepitaxial structures comprising contiguous layers of AlGaAs and GaAs. The principles of operation of such devices are described, for example, in U.S. Pat. No. 3,982,207 issued on Sept. 21, 1976 to Raymond Dingle and Charles H. Henry, hereafter "Dingle." In such devices, the quantum well is a thin layer, here called an active layer, comprising material of relatively low bandgap, bounded on both sides by layers, here called confinement layers, comprising material of higher bandgap. The active layer is thin enough for the optical emission from the recombination of electrons and holes in the layer to exhibit a quantum mechanical size effect. The active layer is usually less than about 300 Å thick.

Typically, the low bandgap material of a quantum well laser is GaAs, and the higher bandgap material is AlGaAs. Electrons and holes created by optical or electrical pumping are captured in the quantum well, where they desirably recombine radiatively, thus emitting radiation. It is advantageous to confine the laser radiation in thin-film optical waveguides adjacent to the active layer. Thus, in a so-called "separate confinement heterostructure" laser, at least one confinement layer also functions as a waveguide. This is achieved by bounding the waveguiding confinement layer on the side opposite the active layer by a layer having a lower refractive index. Although the active layer has a higher refractive index than the confinement layers, it is too thin to confine radiation and act as a waveguide. Thus, the recombining carriers are confined in the active layer, and the radiation is "separately confined" in one or more waveguiding layers.

The (Al, Ga)(As) material system is advantageous for growing heteroepitaxial structures because the mole fraction of aluminum, relative to gallium, can be varied from 0 to 100% without substantially affecting the lattice constant. As a result, heteroepitaxial structures can be grown without appreciable lattice strain. However, the laser emission from this material system occurs at wavelengths that are too short to be useful for many applications in optical communications. That is, because of considerations pertaining to transmission loss in optical fibers, the most useful wavelengths for optical communication are 1.3 and 1.55 $\mu$m. However, the band gaps of (Al, Ga)(As) materials are too large for laser emission to take place at such wavelengths. A typical wavelength of laser emission from GaAs, for example, is about 0.87 $\mu$m.

As a consequence, there is great interest in alternative, lower bandgap III-V material systems in the (In, Ga)(As, P) system. Quantum well lasers of the (In, Ga)(As, P) material system are advantageous because they can be operated at the wavelengths most useful for optical communication; namely, at 1.3 and 1.55 $\mu$m. The quaternary material InGaAsP is advantageously used for the confinement regions, and the ternary material InGaAs is advantageously used for the active regions. The binary material InP has a smaller refractive index than the quaternary material, and therefore quaternary layers bounded by InP are readily used as waveguiding layers.

However, when the lasers are grown using conventional metalorganic vapor-phase epitaxy, it is found that the quaternary material does not grow well on the ternary material. In particularly, the top quaternary layer is found to exhibit an unacceptable amount of strain and an unacceptably high density of dislocations. Dislocations are undesirable because they enhance the rate of nonradiative recombination, and thus decrease the efficiency of the laser. In consequence, the threshold current of the laser is increased.

SUMMARY OF THE INVENTION

More generally, quaternary layers are inherently difficult to grow, and it is advantageous for improving the quality of such layers to provide a binary base having a high degree of crystalline perfection for a quaternary layer to grow on.

We have found that ternary/quaternary interfaces of improved quality can be grown by metalorganic vapor-phase epitaxy when one or several monolayers of binary material, for example InP, are grown between the ternary and quaternary layers. Additionally, we have found that in order to form a relatively sharp transition in material composition at each interface, it is desirable to flush the growth chamber with at least one Group V hydride gas, and preferably with two Group V hydride gases in succession, after each layer has been grown, but before the growth of the succeeding layer. We have found that the first flush gas should correspond in composition to the Group V element characteristic of the layer just deposited, and the second flush gas should likewise correspond to the succeeding layer. (If the composition of a layer comprises only one Group V element, then that element is "characteristic" of the layer. If the composition of the last-deposited layer comprises two Group V elements, then whichever of those elements is absent from the succeeding layer is "characteristic" of the last-deposited layer. Likewise, if the composition of the succeeding layer comprises two Group V elements, then whichever of those elements is absent from the last-deposited layer is "characteristic" of the succeeding layer.) We have found that as a result of the binary buffer layer, crystalline perfection near the interface is improved, and the threshold current of quantum well lasers made according to the invention is reduced. We have also found that as a result of the flush technique using pairs of Group V hydrides, interfaces of improved sharpness can be achieved. Such improved sharpness also contributes to lowering the threshold current of quantum well lasers.

In a preferred embodiment, the ternary material is InGaAs, and the quaternary material is InGaAsP. Between the ternary and quaternary layers, a thin layer of the binary material InP is grown. The InP layer should be at least one, but not more than about ten, atomic planes in thickness, and it is preferably about 10 Å thick, corresponding to the thickness of about two atomic planes. After depositing InGaAs or InGaAsP, but before depositing InP, the growth chamber is flushed first with arsine, and then with phosphine. The order of these gases is reversed when the growth chamber is flushed after depositing InP, but before depositing InGaAs or InGaAsP.

Thus, in a broad sense, our invention is a method for forming a heteroepitaxial structure comprising first and second layers of III-V semiconductor materials, where the first layer has at least three elemental components, and the second layer has at least four elemental components. For purposes of this invention, an epitaxial pair of semiconductor layers forms a heteroepitaxial structure if the respective bandgaps differ by at least 0.1 eV. This gives rise to a room-temperature energy barrier of about 4 kT and would thus impede carrier flow at room temperature. The method comprises the steps of: placing a substrate in a vapor-phase epitaxial growth chamber, forming the first and second layers, and between the first and second layers, and epitaxial with them, forming a binary layer of III-V semiconductor material. The binary material is preferably at least one, but not more than ten, monolayers thick. At least one component of the binary layer is common to the first and second layers.

BACKGROUND OF THE INVENTION

DETAILED DESCRIPTION

As a pedagogic aid to a more complete understanding of the invention, the steps involved in making, for example, a quantum well laser are described below.

Figure 1:
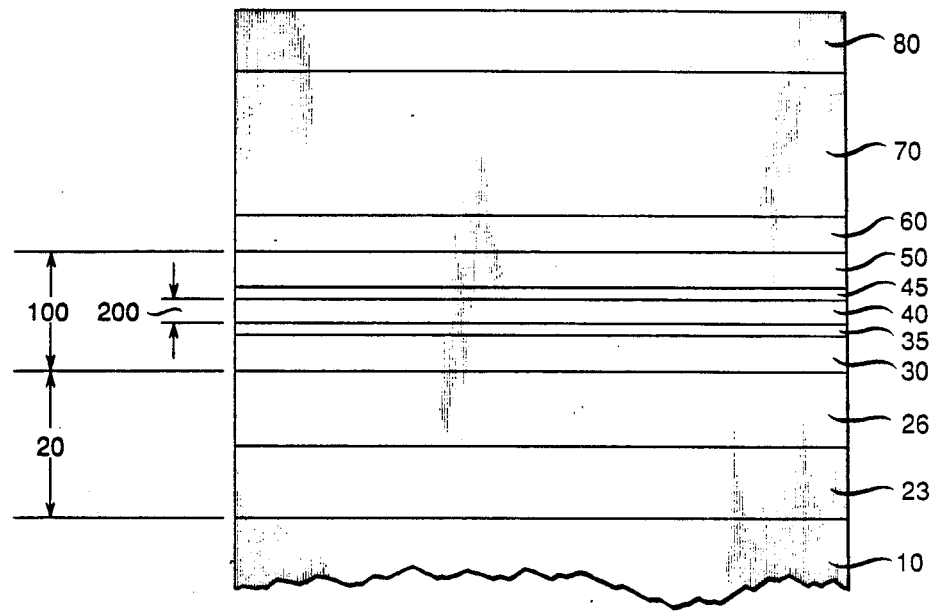
FIG. 1 is a schematic representation of a quantum well laser made according to the inventive method.

Turning to FIG. 1, there is shown an illustrative quantum well laser made in accordance with the inventive method. First, a substrate 10 is placed in the growth chamber of a reactor for metalorganic vapor-phase epitaxy (MOVPE). The substrate material is preferably a binary III-V material, and still more preferably is InP. Typically, electrical contact of one polarity, e.g., negative polarity, is made through the substrate, and the substrate material is doped to produce a corresponding conductivity type, e.g., n-type.

Next, an optical buffer region 20 is advantageously grown directly on substrate 10. The purpose of region 20 is to initiate epitaxial growth on the substrate, which has been chemically and mechanically processed. The buffer region is preferably of the same composition and conductivity type as the substrate. Still more preferably, the optical buffer region comprises a highly doped layer 23 grown directly on the substrate to minimize contact resistance to the lasing region, and a more lightly doped layer 26 grown directly on layer 23 to minimize diffusion of the dopant into the active laser region, because such diffusion could adversely affect the recombination properties. For example, layer 23 is desirably n-type InP, with a thickness at least 0.1 $\mu$m in order to insure good growth nucleation on the substrate, but not more than 1.0 $\mu$m because this would not add to the desired result but would unnecessarily increase the process cost, and with a doping level in the range $3 \times 10^{17}$ to $5 \times 10^{18}$ cm$^{-3}$ in order to provide good electrical conduction. Layer 26 is desirably n-type InP, with a thickness at least 0.1 $\mu$m in order to isolate the heavily doped layer 23 from the active laser area, but not more than 1.0 $\mu$m because this, again, would not add to the desired result, and with a (lower) doping level in the range $1 \times 10^{17}$ to $5 \times 10^{17}$ cm$^{-3}$ in order to provide adequate electrical conduction for current flow through the device.

Following the growth of buffer region 20, laser heterostructure 100 is grown. Heterostructure 100 comprises confinement layer 30, active region 200, and waveguide layer 50. Active region 200 comprises at least one active layer 40.

Whenever the growth of one layer is followed by the growth of a second layer of a different elemental composition, the reactor may be flushed by a flow of gas to remove constituents of one composition before growth of a second composition. This aids in achieving sharp interfaces. Advantageously, the flush comprises a Group V hydride gas. Still more advantageously, each flushing step comprises two separate flows of gas. The first flush comprises a gas corresponding in composition to the layer last grown, and the second flush comprises a gas corresponding in composition to the layer next to be grown. Thus, for example, if buffer layer 26 is InP and confinement layer 30 is InGaAsP, then after the growth of layer 26, the reactor is flushed first with phosphine and then with arsine.

Heterostructure 100 includes a quantum well in the region of layer 40, created by the difference in bandgaps between layer 40, on the one hand, and layers 30 and 50, on the other. To this end, the material composition of layers 30 and 50 should be chosen such that layers 30 and 50 have a band gap greater than the band gap of active layer 40. The difference in the band gaps should be great enough to form a quantum well capable of confining electrons and holes within layer 40. The design of quantum well laser heterostructures is described, for example, in Dingle, incorporated herein by reference, and also in U.S. Pat. No. 4,599,728, issued on Jul. 8, 1986 to K. Alavi, et al., also incorporated herein by reference.

The thickness of confinement layer 30 should be at least 0.05 $\mu$m in order to confine the optical field, but not more than 0.5 $\mu$m because at about that thickness the confinement factor becomes essentially unity, and therefore additional thickness does not add to the desired result. The thickness of waveguide layer 50 should fall within the same limits, for the same reasons. The thicknesses of layers 30 and 50 are preferably about 0.05 $\mu$m.

The compositions of layers 30, 40, and 50 are III-V semiconductors, preferably of the (In, Ga)(As, P) material system. Layers 30 and 50 are advantageously of quaternary composition, and layer 40 is advantageously of ternary composition. Thus, for example, layers 30 and 50 are readily grown from undoped InGaAsP having a band-gap wavelength of, e.g., 1.25–1.46 $\mu$m, and layer 40 is readily grown from undoped InGaAs having a band-gap wavelength of, e.g., 1.66 $\mu$m.

After layer 30 is grown, but before layer 40 is grown, cladding layer 35 is grown on layer 30. Layer 35 must be thin enough that carriers readily tunnel through it, so that current flow is not impeded. Layer 35 must also be thin enough that it does not affect optical confinement in heterostructure 100. To those ends, the thickness of layer 35 is desirably at least one, but not more than ten, atomic planes. Layer 35 is composed of a binary III-V semiconductor material, preferably InP. Thus, for example, layer 35 is readily grown from InP in a layer 0.3–5 nm thick. Between the growth steps of layer 30 and layer 35, the reactor is flushed as described above. Thus in the present example, the reactor is preferably flushed first with arsine and then with phosphine. Similarly, the reactor may be flushed between the growth steps of layer 35 and layer 40. In the present example, the reactor is preferably flushed first with phosphine and then with arsine.

Figure 2:
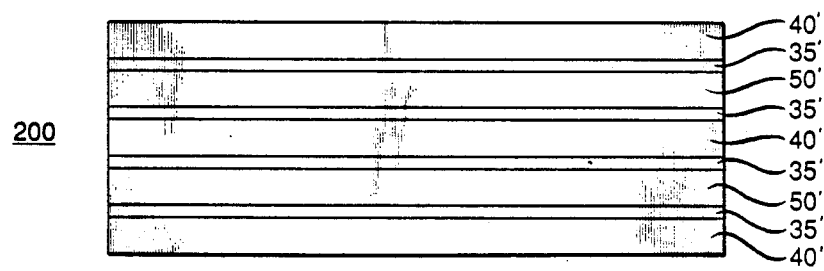
FIG. 2 is a schematic representation of the active region of a multiple quantum well laser made according to the inventive method.

If the laser is to be a single quantum well laser, active region 200 simply consists of a thin active layer 40. In that case, the growth of active layer 40 is followed by a gas flush, as described above, the growth of cladding layer 45, similar to cladding layer 35, another gas flush, as described above, and then by the growth of waveguide layer 50. If, on the other hand, the laser is to be a multiple quantum well laser, then, with reference to FIG. 2, active region 200 comprises at least two active layers 40', similar in description to active layer 40. The active layers 40' are separated by barrier layers 50', preferably of the same composition as layers 30 and 50. The thickness of barrier layers 50' should be at least 100 Å in order to prevent carrier coupling between the wells, but should not exceed 300 Å because barrier layers substantially thicker than this may optically isolate the active layers, forming separate, optically decoupled lasers. Thus in the present example, the barrier layers are preferably about 0.015 μm thick. Each barrier layer 50' is clad on both sides with a cladding layer 35' similar to layer 35. After growth of the last active layer, cladding layer 45 is grown as described above, and then waveguide layer 50 is grown, as also described above. As described, the reactor is flushed between each pair of growth steps.

Referring back to FIG. 1, growth of waveguide layer 50 is followed by a gas flush, as described, and following this, a setback layer 60 is grown. The purpose of layer 60 is to prevent the diffusion of dopant impurities into the active layers 40 or 40'. The material of setback layer 60 should be chosen to have a lower refractive index than waveguide layer 50 in order to produce optical confinement in waveguide layer 50. The material of layer 60 is undoped, is advantageously a binary III-V material, and is preferably InP. The thickness of layer 60 should be at least 0.01 μm in order to isolate the active area from diffusion of impurities, but not more than 0.2 μm because this might displace the p-n junction away from the recombination region by a distance of the order of a diffusion length, thus reducing injection of carriers into the active layer. Thus, the thickness of layer 60 is preferably about 0.05 μm.

The growth of the setback layer is followed by the growth of an optically isolating cladding layer 70 and then a contact layer 80. For example, if the contact layer is p-type InGaAsP, the cladding layer is advantageously made of p-type InP. Cladding layer 70 should be at least 0.5 μm thick in order to isolate the optically absorbing contact from the lasing region, but not more than 2 μm thick because this would not add to the desired result, and is preferably about 1 μm thick. Contact layer 80 should be at least 0.05 μm thick in order to insure complete coverage of the surface with a low-resistance growth of easily contacted material, but not more than 0.5 μm thick because this would not add to the desired result, and is preferably about 0.2 μm thick. The reactor is flushed, as described, between the growth of layer 70 and layer 80.

EXAMPLE I

A separate confinement single quantum well laser was grown on a (100) n-type InP substrate by metalorganic vapor phase epitaxy. The growth took place in a conventional, atmospheric pressure, horizontal reactor operated at 625° C. The source materials were trimethylindium, trimethylgallium, phosphine diluted to 20% in hydrogen, and arsine diluted to 5% in hydrogen. N-type materials were doped with sulfur, and p-type materials were doped with zinc, using hydrogen sulfide and diethylzinc, respectively, as the dopant source materials.

The process steps are described with reference to FIG. 1. First, a highly doped n-InP buffer layer 23 was grown directly on the substrate 10. This layer was 0.5 μm thick, and doped at $1 \times 10^{18}$ cm$^{-3}$. Next, a lightly doped n-InP buffer layer 26 was grown. This layer was 0.5 μm thick, and doped at $3 \times 10^{17}$ cm$^{-3}$. Following this step, the reactor was flushed with phosphine for two seconds, and then with arsine for two seconds. (All subsequent gas flushes also used arsine and phophine and lasted for two seconds.) Next, a 50-nm-thick confinement layer 30 of undoped InGaAsP (having a bandgap wavelength of 1.25-1.46 μm) was deposited, followed by an arsine flush and then a phosphine flush. Following this, a monolayer 35 of InP (0.3-5 nm in thickness) was deposited, followed by a phosphine flush and then an arsine flush. Next, an active layer 40 of InGaAs 10-20 nm in thickness was deposited, followed by an arsine flush and then a phosphine flush. A second InP monolayer 45 was then deposited, followed by a phosphine flush and then an arsine flush. Next, a 50-nm-thick waveguide layer 50 of InGaAsP (having a bandgap wavelength of 1.25-1.46 μm) was deposited, followed by an arsine flush and then a phosphine flush. Following this, a 50-nm-thick setback layer 60 of undoped InP was deposited. Next, a 1-μm-thick cladding layer 70 of p-InP doped at $5 \times 10^{17}$ cm$^{-3}$ was deposited, followed by a phosphine flush and an arsine flush. This was followed by growth of a 0.2-μm-thick p-InGaAsP contact layer 80 doped to $3 \times 10^{18}$ cm$^{-3}$.

The single quantum well structure was examined by bright-field cross sectional transmission electron microscopy (TEM) using a Philips 420 microscope operated at 120 keV. Samples were prepared by chemical thinning with brominated methanol using a grid masking technique after the removal of the cap layers. TEM micrographs were taken using a [400] reflection to reveal interfacial strain and defects. Although a weak strain contrast was observed at the interface, the structure was basically of high quality. By contrast, micrographs of a control sample, grown by the identical procedure but omitting the InP cladding of the quantum wells, revealed strong interfacial strain and a highly dislocated top layer (i.e., the layer farthest from the substrate). The dislocations were all observed to originate from the defective top interface.

Room-temperature photoluminescence measurements showed that the InP cladding improved both efficiency and uniformity of luminescence by at least a factor of ten over the control sample. Under high excitation, the photoluminescence intensity showed a dominant peak at 1.58-1.60 μm, with a negligible intensity from the quaternary cladding layers, indicating that carriers were effectively confined in the wells, and indicating very small optical absorption in the confinement layers. When quaternary layers were substituted having a bandgap wavelength of 1.25 instead of 1.46 μm, there was observed a negligible change in both the electroluminescence and the photoluminescence peak wavelengths, which remained at 1.58-1.60 μm. This clearly indicates that recombination occurred mainly within the quantum wells.

The threshold current for laser operation at 20° C. was found to be about 55 mA. The output optical power was found to depend linearly on current up to a power of 18 mW per facet. The external differential quantum efficiency was found to be 19% per facet. The laser operated continuously at temperatures above 50° C. The laser emission occurred close to the heavy hole exciton energy of about 1.55 μm.

EXAMPLE II

A quantum well laser having two wells was grown in accordance with the inventive method. Between the two wells, an additional layer of InGaAsP, 15 nm thick, was grown between the quantum well layers. That is, the sequence of growth was: the first quantum well layer, an InP cladding layer, the additional InGaAsP layer, an InP cladding layer, and the second quantum well layer. Before the additional InGaAsP layer was grown, the growth chamber was flushed with phosphine and then arsine. After the layer was grown, the growth chamber was flushed with arsine and then phosphine. In all other respects, the procedure followed was the same as in Example I.

Figure 3:
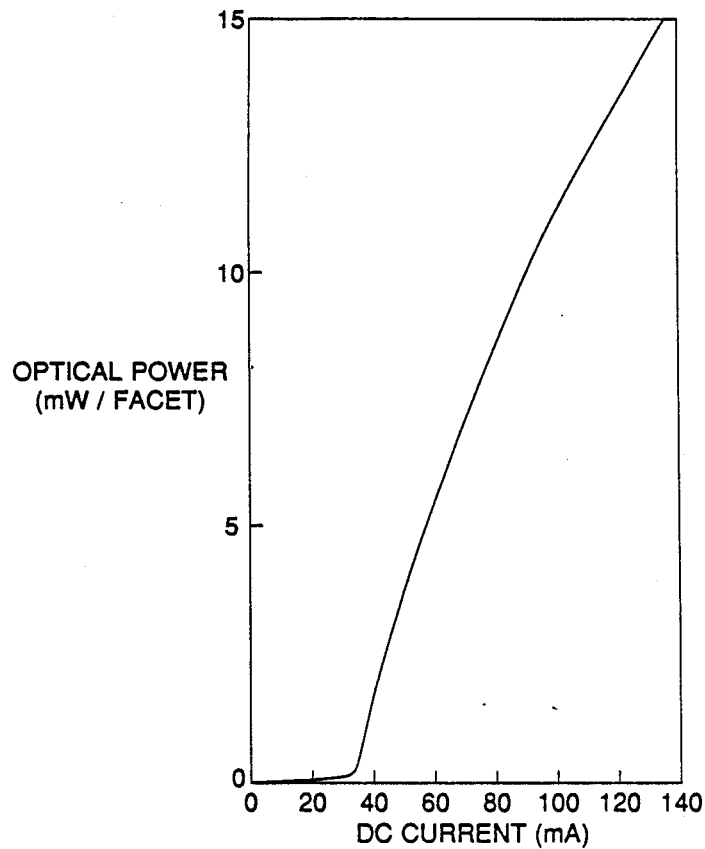
FIG. 3 is a graph depicting the relationship between optical power and current for CW operation of a double quantum well laser according to the invention.

FIG. 3 shows how the optical output power of this laser depended on current, for CW operation at 20° C. It is apparent from FIG. 3 that the threshold current at this temperature was 35 mA, and the output power was linearly dependent on current up to a power of 15 mW per facet. The external differential quantum efficiency was found to be 21% per facet. An investigation of the effect of temperature on the light output vs. current relationship showed that the threshold temperature $T_0$ was 76° K., with no break point above room temperature. The laser operated continuously at temperatures above 50° C. The laser emission occurred at about 1.55 μm, representing a high-energy shift from the room-temperature band-edge wavelength of 1.66 μm. This shift was clear evidence of a quantum size effect. The emission consisted of 2-3 longitudinal modes.

We claim:

1. A method for forming a heteroepitaxial structure, comprising the steps of:
   placing a substrate in a vapor-phase epitaxial growth chamber,
   forming, on the substrate, a first layer of III-V compound semiconductor material having at least three elemental components, and
   forming, on the substrate, a second layer of III-V compound semiconductor material having at least four elemental components such that the composition of the second layer is different from the composition of the first layer, whereby the first and second layers form a heteroepitaxial structure,
   CHARACTERIZED IN THAT the method additionally comprises, between the first and second layer-forming steps, the step of:
   forming a binary layer of III-V semiconductor material at least one, but not more than ten, monolayers thick on the substrate, at least one component of the binary layer being common to the first and second layers.

2. The method of claim 1, wherein the first-layer compound semiconductor material is a ternary material, and the second-layer compound semiconductor material is a quaternary material.

3. The method of claim 1, wherein the first-layer compound semiconductor material is a quaternary material, and the second-layer compound semiconductor material is also a quaternary material.

4. The method of claim 1, wherein the placing step comprises placing a substrate in a metalorganic vapor-phase epitaxial growth chamber, and the method further comprises, between the first layer-forming step and the binary layer-forming step, the steps of:
   first flushing the growth chamber with a gas comprising a Group V hydride characteristic of the composition of the layer last formed, and
   then flushing the growth chamber with a gas comprising a Group V hydride characteristic of the composition of the layer next to be formed,
   and the method further comprises, between the second layer-forming step and the binary layer-forming step, the steps of:
   first flushing the growth chamber with a gas comprising a Group V hydride characteristic of the composition of the layer last formed, and
   then flushing the growth chamber with a gas comprising a Group V hydride characteristic of the composition of the layer next to be formed.

5. The method of claim 4, wherein the first layer is InGaAs, the second layer is InGaAsP, the binary layer is InP, and the Group V hydrides for flushing are arsine and phosphine.

6. A device made in accordance with the method of claim 1.

7. A quantum well laser, comprising:
   a confinement layer of InGaAsP;
   a waveguide layer of InGaAsP;
   and an active region comprising an active layer of InGaAs between the confinement layer and the waveguide layer, the active layer comprising a quantum well;
   CHARACTERIZED IN THAT the quantum well laser further comprises:
   a first cladding layer of InP between and epitaxial with the confinement layer and the active layer, the first cladding layer being at least 0.3, and not more than 5, nanometers in thickness; and
   a second cladding layer of InP between and epitaxial with the active layer and the waveguide layer, the second cladding layer being at least 0.3, and not more than 5, nanometers in thickness.

8. A quantum well laser, comprising:
   an InP substrate of a first conductivity type;
   a highly doped InP buffer layer epitaxially grown directly on the substrate, and of the same conductivity type as the substrate;
   a lightly doped InP buffer layer epitaxially grown on the highly doped buffer layer and of the same conductivity type as the substrate;
   a confinement layer of undoped InGaAsP epitaxially grown on the lightly doped buffer layer;
   a waveguide layer of undoped InGaAsP;
   an active region comprising at least one active layer of InGaAs between the confinement layer and the waveguide layer, the active layer comprising a quantum well; and
   a highly doped InGaAsP contact layer of opposite conductivity type to the substrate,
   CHARACTERIZED IN THAT the quantum well laser further comprises:
   a first cladding layer of InP between and epitaxial with the confinement layer and an active layer of the active region, the first cladding layer being at least 0.3, and not more than 5, nanometers in thickness;

a second cladding layer of InP between and epitaxial with an active layer of the active region and the waveguide layer, the second cladding layer being at least 0.3, and not more than 5, nanometers in thickness;

a setback layer of undoped InP epitaxially grown on the waveguide layer opposite the second cladding layer; and an optically isolating cladding layer of InP of the opposite conductivity type to the substrate, between and epitaxial with the setback layer and the contact layer.

9. The quantum well laser of claim 8, wherein the active region comprises:

at least two active layers of InGaAs, each of the at least two active layers comprising a quantum well, between each pair of the at least two active layers a barrier layer of InGaAsP, and between each side of each barrier layer and the corresponding active layer an intermediate cladding layer of InP, each intermediate cladding layer being epitaxial with the corresponding barrier layer and the corresponding active layer, each intermediate cladding layer being at least 0.3, and not more than 5, nanometers in thickness.

* * * * *